(12) United States Patent
Jang et al.

(10) Patent No.: US 8,381,965 B2
(45) Date of Patent: Feb. 26, 2013

(54) THERMAL COMPRESS BONDING

(75) Inventors: Bor-Ping Jang, Chu-Bei (TW);
Kuei-Wei Huang, Hsin-Chu (TW);
Wei-Hung Lin, Xinfeng Township
(TW); Chung-Shi Liu, Shin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/841,858

(22) Filed: Jul. 22, 2010

(65) Prior Publication Data
US 2012/0018494 A1    Jan. 26, 2012

(51) Int. Cl.
*B23K 31/02* (2006.01)
(52) U.S. Cl. .............. 228/180.22; 228/228; 228/234.1
(58) Field of Classification Search .............. 228/180.22, 228/49.5
See application file for complete search history.

(56) References Cited

U.S. PATENT DOCUMENTS

| | | | | |
|---|---|---|---|---|
| 3,006,067 A | * | 10/1961 | Anderson et al. | 228/265 |
| 3,458,102 A | | 7/1969 | Zanger et al. | |
| 4,607,779 A | * | 8/1986 | Burns | 228/106 |
| 4,763,827 A | * | 8/1988 | Watanabe et al. | 228/102 |
| 4,865,245 A | * | 9/1989 | Schulte et al. | 228/116 |
| 4,878,611 A | * | 11/1989 | LoVasco et al. | 228/180.22 |
| 5,059,559 A | * | 10/1991 | Takahashi et al. | 228/105 |
| 5,113,581 A | | 5/1992 | Hidese | |
| 5,148,968 A | | 9/1992 | Schmidt et al. | |
| 5,244,142 A | * | 9/1993 | Nishiguchi et al. | 228/180.22 |
| 5,249,726 A | | 10/1993 | Sato | |
| 5,346,857 A | * | 9/1994 | Scharr et al. | 228/180.22 |
| 5,385,291 A | * | 1/1995 | Latta | 228/180.22 |
| 5,397,423 A | | 3/1995 | Bantz et al. | |
| 5,439,161 A | * | 8/1995 | Kawatani et al. | 228/180.21 |
| 5,441,195 A | | 8/1995 | Tustaniwskyj et al. | |
| 5,611,481 A | * | 3/1997 | Akamatsu et al. | 228/180.22 |
| 5,632,434 A | * | 5/1997 | Evans et al. | 228/44.7 |
| 5,639,696 A | | 6/1997 | Liang et al. | |
| 5,698,068 A | * | 12/1997 | Ichikawa et al. | 156/581 |
| 5,745,986 A | * | 5/1998 | Variot et al. | 29/840 |
| 5,769,998 A | * | 6/1998 | Tanzawa et al. | 156/285 |
| 5,796,161 A | | 8/1998 | Moon | |
| 5,964,396 A | * | 10/1999 | Brofman et al. | 228/180.22 |
| 5,968,670 A | * | 10/1999 | Brofman et al. | 428/576 |
| 5,975,409 A | | 11/1999 | Brofman et al. | |

(Continued)

FOREIGN PATENT DOCUMENTS

| | | |
|---|---|---|
| JP | 2-206138 A | 8/1990 |
| JP | 04-093041 A * | 3/1992 |

(Continued)

OTHER PUBLICATIONS

"Process for Elongating Semiconductor Device Solder Connections," TDB-ACC-NO: NN84081579; IBM Technical Disclosure Bulletin, vol. 27, No. 3 Aug. 1, 1984, 2 pgs.

*Primary Examiner* — Kiley Stoner
(74) *Attorney, Agent, or Firm* — Slater & Matsil, L.L.P.

(57) ABSTRACT

A method includes providing a substrate carrier including work piece holders, and placing a first plurality of work pieces into the work piece holders. A second plurality of work pieces is picked up and placed, with each of the second plurality of work pieces being placed on one of the first plurality of work pieces. Solder bumps between the first and the second plurality of work pieces are then reflowed to simultaneously bond the first and the second plurality of work pieces together.

14 Claims, 9 Drawing Sheets

U.S. PATENT DOCUMENTS

| | | | |
|---|---|---|---|
| 5,984,165 A | 11/1999 | Inoue et al. | |
| 6,131,795 A | 10/2000 | Sato | |
| 6,142,356 A | 11/2000 | Yamazaki et al. | |
| 6,158,650 A | 12/2000 | Holzmann | |
| 6,237,832 B1 | 5/2001 | Chung | |
| 6,240,634 B1* | 6/2001 | Kira et al. | 29/836 |
| 6,279,815 B1* | 8/2001 | Correia et al. | 228/180.21 |
| 6,283,358 B1* | 9/2001 | Ball | 228/180.21 |
| 6,334,566 B1 | 1/2002 | Ball et al. | |
| 6,432,907 B1* | 8/2002 | Skold et al. | 510/470 |
| 6,501,051 B1* | 12/2002 | Richert et al. | 219/388 |
| 6,550,665 B1* | 4/2003 | Parrish et al. | 228/180.22 |
| 6,621,157 B1 | 9/2003 | Wirz et al. | |
| 6,796,481 B2* | 9/2004 | Yamauchi | 228/180.1 |
| 6,890,795 B1 | 5/2005 | Wong et al. | |
| 6,942,137 B2 | 9/2005 | Bolde et al. | |
| 7,134,589 B2 | 11/2006 | Balon | |
| 7,165,711 B2* | 1/2007 | Barretto et al. | 228/49.5 |
| 7,235,886 B1 | 6/2007 | Chandran et al. | |
| 7,257,887 B2* | 8/2007 | Lee | 29/743 |
| 7,287,685 B2* | 10/2007 | Farooq et al. | 228/180.22 |
| 7,299,965 B2* | 11/2007 | Sato | 228/180.22 |
| 7,353,596 B2* | 4/2008 | Shida et al. | 29/844 |
| 7,370,258 B2 | 5/2008 | Iancu et al. | |
| 7,455,213 B2* | 11/2008 | Nishiyama | 228/180.22 |
| 7,569,939 B2 | 8/2009 | Khandekar et al. | |
| 7,699,210 B2* | 4/2010 | Suh | 228/180.21 |
| 7,703,657 B2 | 4/2010 | Matsumura et al. | |
| 7,712,652 B2* | 5/2010 | Morita et al. | 228/180.22 |
| 7,731,077 B2* | 6/2010 | Farooq et al. | 228/180.22 |
| 7,752,742 B1* | 7/2010 | Schweikert et al. | 29/743 |
| 7,837,083 B2* | 11/2010 | MacKay et al. | 228/39 |
| 2002/0056740 A1 | 5/2002 | Hayashi | |
| 2002/0092610 A1 | 7/2002 | Funaya et al. | |
| 2002/0109000 A1* | 8/2002 | Rinne | 228/102 |
| 2002/0140094 A1 | 10/2002 | Kubota et al. | |
| 2003/0094241 A1 | 5/2003 | Huang et al. | |
| 2004/0238595 A1* | 12/2004 | Nogiwa et al. | 228/49.5 |
| 2005/0035182 A1* | 2/2005 | Mano et al. | 228/180.22 |
| 2005/0061856 A1* | 3/2005 | Maki et al. | 228/234.1 |
| 2006/0244128 A1 | 11/2006 | Hayashi et al. | |
| 2006/0266792 A1* | 11/2006 | Ko et al. | 228/6.2 |
| 2007/0000592 A1* | 1/2007 | Fares et al. | 156/64 |
| 2007/0099412 A1 | 5/2007 | Miyazaki | |
| 2007/0108594 A1 | 5/2007 | Ishii | |
| 2007/0284421 A1 | 12/2007 | Gillotti et al. | |
| 2007/0287262 A1* | 12/2007 | Maki et al. | 438/455 |
| 2008/0035274 A1* | 2/2008 | Kanisawa | 156/583.1 |
| 2008/0085571 A1 | 4/2008 | Tong et al. | |
| 2008/0158843 A1 | 7/2008 | So et al. | |
| 2008/0171404 A1 | 7/2008 | Zakel et al. | |
| 2009/0008800 A1 | 1/2009 | Nakatani et al. | |
| 2009/0091025 A1 | 4/2009 | Wong et al. | |
| 2009/0125141 A1* | 5/2009 | Noda et al. | 700/121 |
| 2009/0126188 A1* | 5/2009 | Sakai et al. | 29/832 |
| 2009/0127315 A1 | 5/2009 | Okita | |
| 2009/0229853 A1 | 9/2009 | Fukuda | |
| 2010/0288416 A1* | 11/2010 | Hamazaki | 156/60 |

FOREIGN PATENT DOCUMENTS

| | | | |
|---|---|---|---|
| JP | 04-216640 A * | 8/1992 | |
| JP | 05-144870 A * | 6/1993 | |
| JP | 05-190601 A * | 7/1993 | |
| JP | 7170094 A | 7/1995 | |
| JP | 08-032296 A * | 2/1996 | |
| JP | 10-223693 A | 8/1998 | |
| JP | 2000100837 A | 4/2000 | |
| JP | 2002-026494 A * | 1/2002 | |
| JP | 2003303856 | 10/2003 | |

* cited by examiner

THERMAL COMPRESS BONDING

TECHNICAL FIELD

This disclosure relates generally to integrated circuit manufacturing processes, and more particularly to thermal compress bonding.

BACKGROUND

Integrated circuits are formed on semiconductor wafers, which are then sawed into semiconductor chips. The semiconductor chips are then bonded onto package substrates. FIGS. 1 through 3 illustrate cross-sectional views of intermediate stages in a conventional bonding process. Referring to FIG. 1, package substrate 100 is provided, and bond pads 108 are at the surface of package substrate 100. Chip 102 is picked up and flipped over, with solder bumps 104 at a surface of chip 102 facing down. Flux 106 is also applied on solder bumps 104.

Next, as shown in FIG. 2, chip 102 is placed on package substrate 100, with solder bumps 104 being placed against bond pads 108. Package substrate 100 and chip 102 then go through a reflow process, during which package substrate 100 and chip 102, and solder bumps 104 are heated. The resulting bonded structure is shown in FIG. 3. Due to the weight of chip 102 and solder bumps 104, solder bumps 104, when melted, are collapsed, and width W1 of solder bumps 104 increases.

One of the problems found in the conventional bond structures is that cracking often occurs in solder bumps 104 after the bonding process, particularly near wherein solder bumps 104 join solder resists 112 and passivation layer (or polyimide layer) 114. In addition, due to the increase in width W1 of solder bumps 104, the spacing between neighboring solder bumps 104 decreases, causing greater risk of shorting bumps 104 to each other.

SUMMARY

In accordance with one aspect, a method includes providing a substrate carrier including work piece holders, and placing a first plurality of work pieces into the work piece holders. A second plurality of work pieces is picked up and placed, with each of the second plurality of work pieces being placed on one of the first plurality of work pieces. Solder bumps between the first and the second plurality of work pieces are then reflowed to simultaneously bond the first and the second plurality of work pieces together.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 4B through 7 illustrate cross-sectional views of intermediate stages in a thermal compress bonding (TCB) process in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel thermal compression bonding (TCB) process is provided. The intermediate stages of manufacturing various embodiments are illustrated. Throughout the various views and illustrative embodiments, like reference numbers are used to designate like elements.

Figure 1:
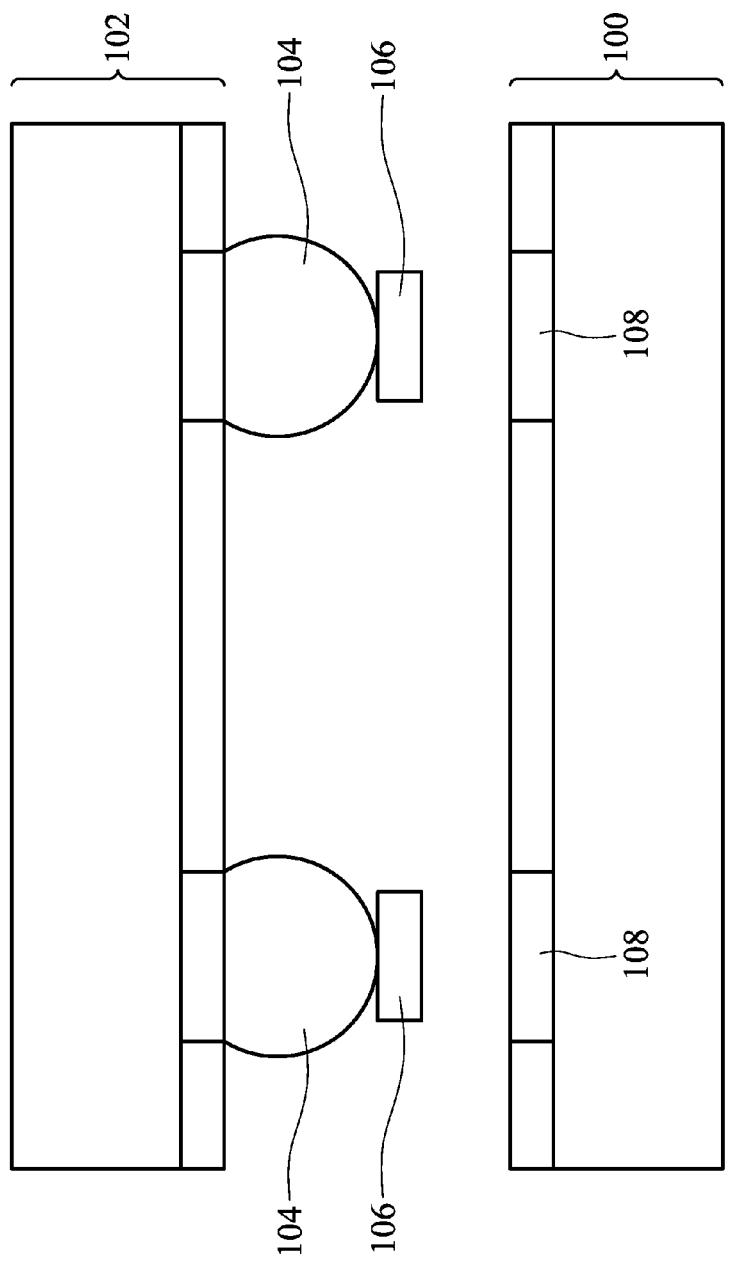
FIGS. 1 through 3 illustrate cross-sectional views of intermediate stages in a conventional bonding process.
Figure 2:
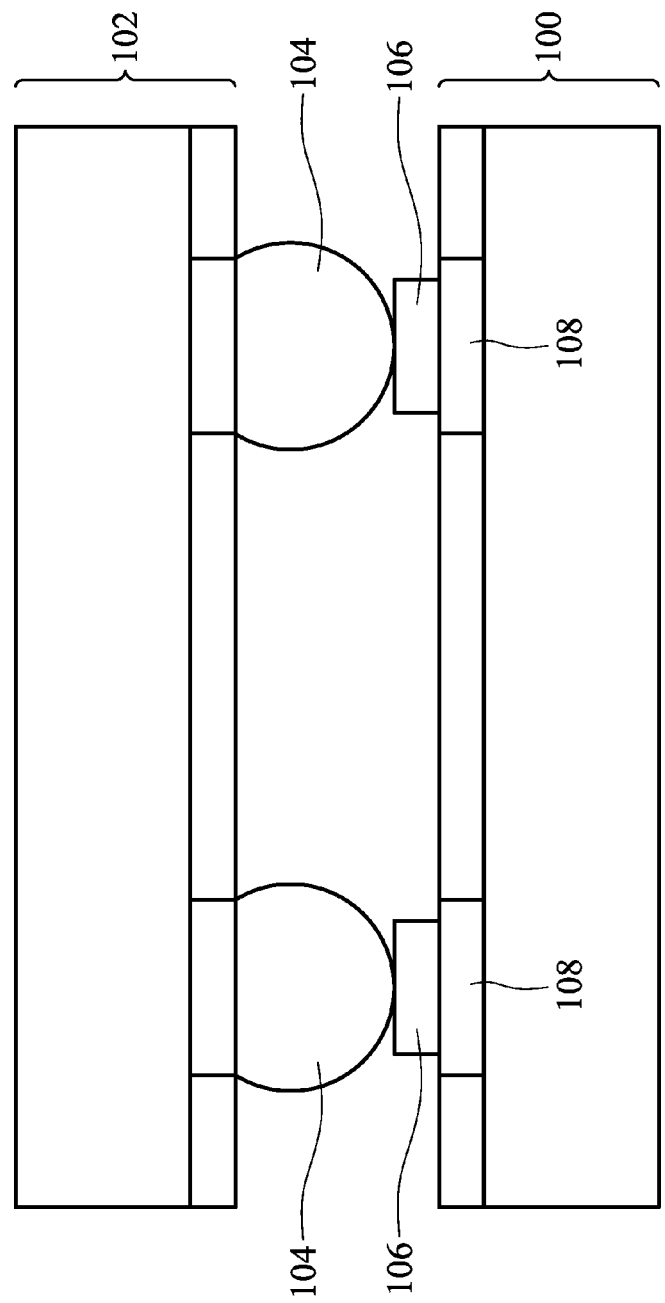
Figure 3:
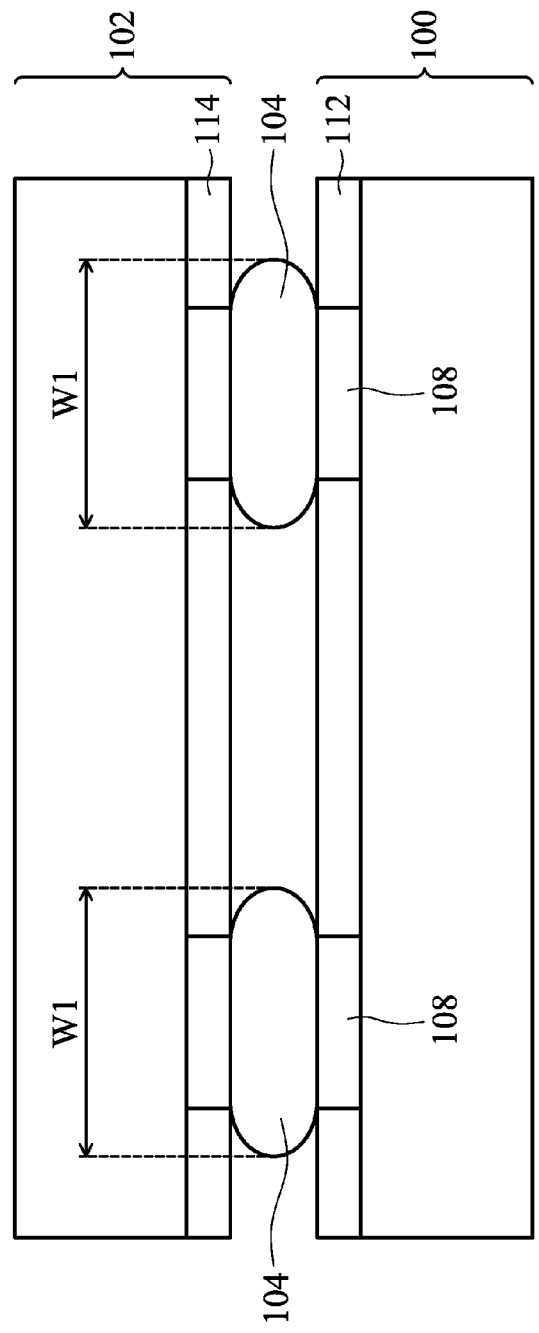
Figure 4A:
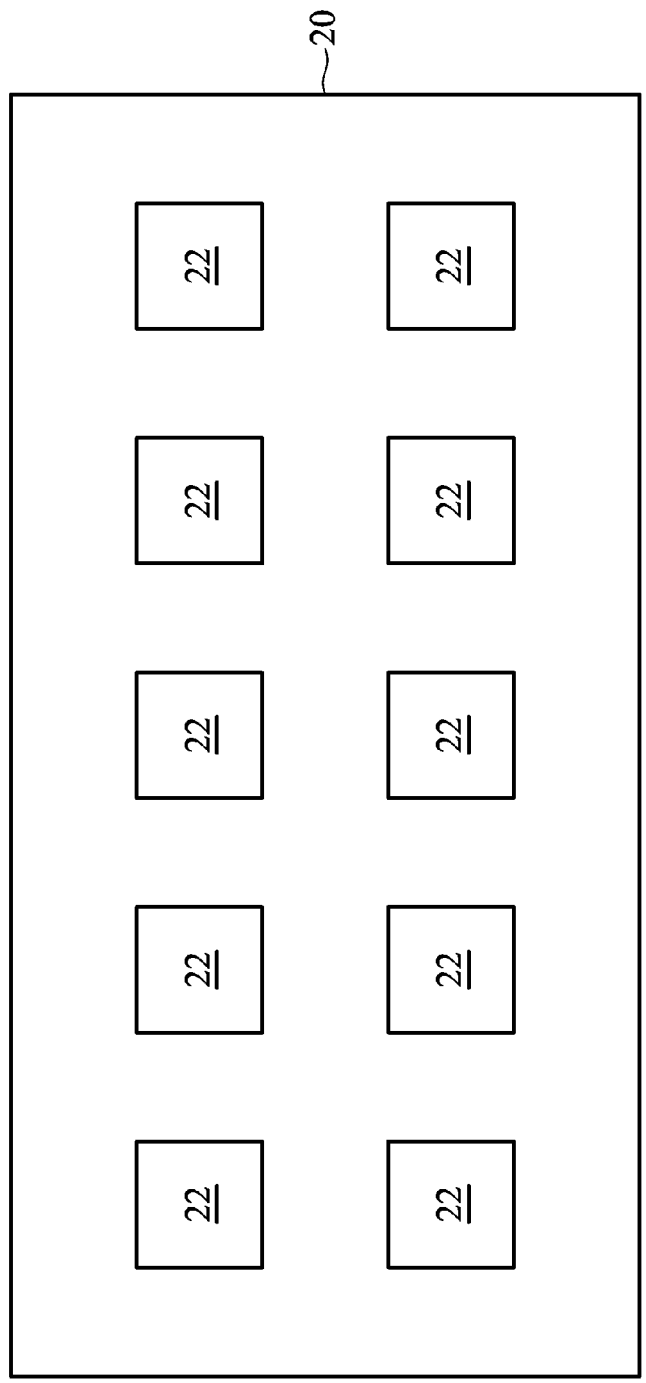
FIG. 4A illustrates a top view of a substrate carrier.
Figure 4B:
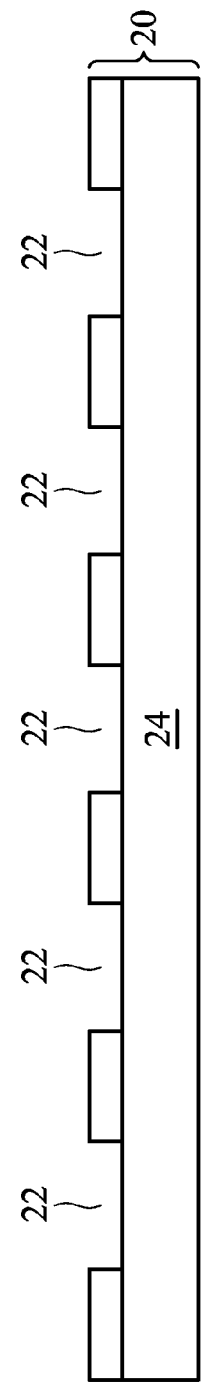

FIGS. 4A and 4B illustrate a top view and a cross-sectional view, respectively, of substrate carrier 20. Substrate carrier 20 includes a plurality of work piece holders 22, which may be arranged as an array having rows and columns. As shown in FIG. 4B, work piece holders 22 may be holes having the size of work pieces 26 (not shown in FIGS. 4A and 4B, please refer to FIG. 5) that will be placed therein. In an embodiment, heater 24 is placed under, or built in, substrate carrier 20 for heating the work pieces placed in work piece holders 22. In alternative embodiments, substrate carrier 20 includes no heater.

Figure 5:
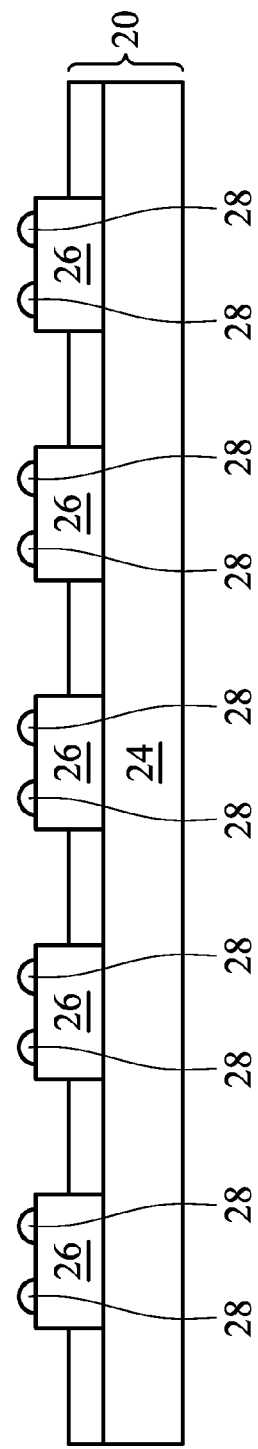

Referring to FIG. 5, work pieces 26 are placed into work piece holders 22. In an embodiment, work pieces 26 are package substrates or interposers, which do not have active devices such as transistors therein. In alternative embodiments, work pieces 26 are device dies having active devices such as transistors (not shown) therein. Metal bumps 28 are formed on top surfaces of work pieces 26. In an embodiment, all work piece holders 22 are filled with work pieces 26. Alternatively, a part, by not all, of work pieces holders 22 is filled.

Figure 6A:
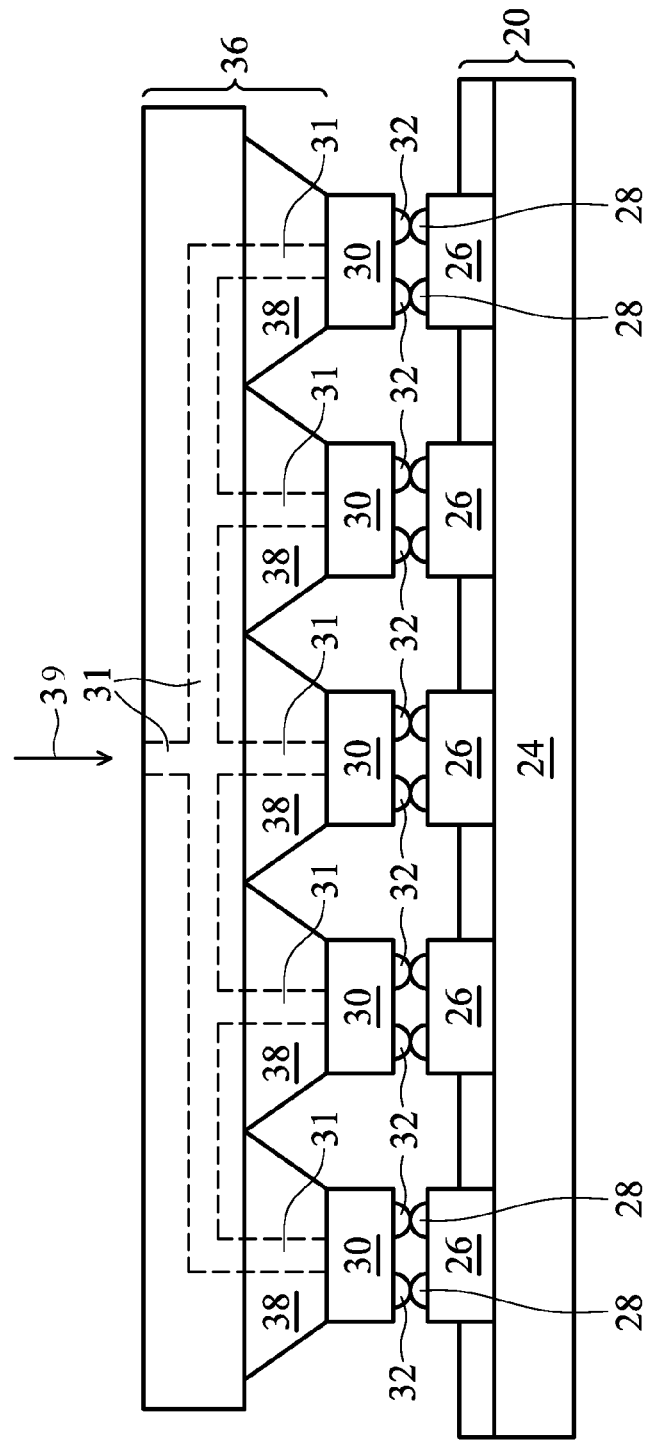
Figure 6B:
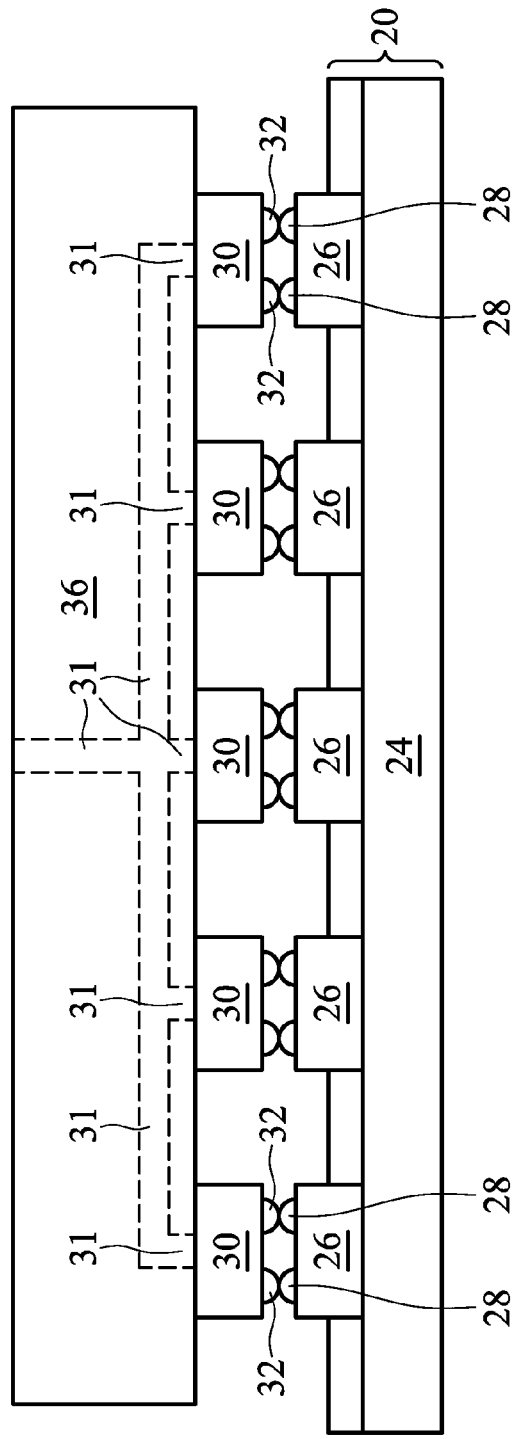

Next, as shown in FIGS. 6A and 6B, work pieces 30 are picked up and placed onto work pieces 26. Metal bumps 32 at bottom surfaces of work pieces 30 are in contact with metal bumps 28. Work pieces 30 may be device dies (chips) comprising active devices (not shown), which may be transistors. Alternatively, work pieces 30 may be interposers, package substrates, or the like. In an embodiment, metal bumps 32 are solder bumps, although they can be other type of bumps such as copper bumps. However, at least one, and may be both, of metal bumps 28 and 32 are solder bumps. In the following illustrated exemplary embodiments, metal bumps 28 and 32 are all solder bumps.

Heating tool 36 is placed over and contacting work pieces 30, and may apply a downward force (symbolized by arrow 39) on work pieces 30, so that metal bumps 28 and 32 are pressed against each other to prevent work pieces 30 from slipping. In FIG. 6A, heating tool 36 includes a plurality of heating heads 38. When placed over work pieces 30, each of heating heads 38 is aligned to, and contacts, one of work pieces 30. In FIG. 6B, heating tool 36 includes only one heating head that has a size great enough to contact all of work pieces 30.

Figure 7:
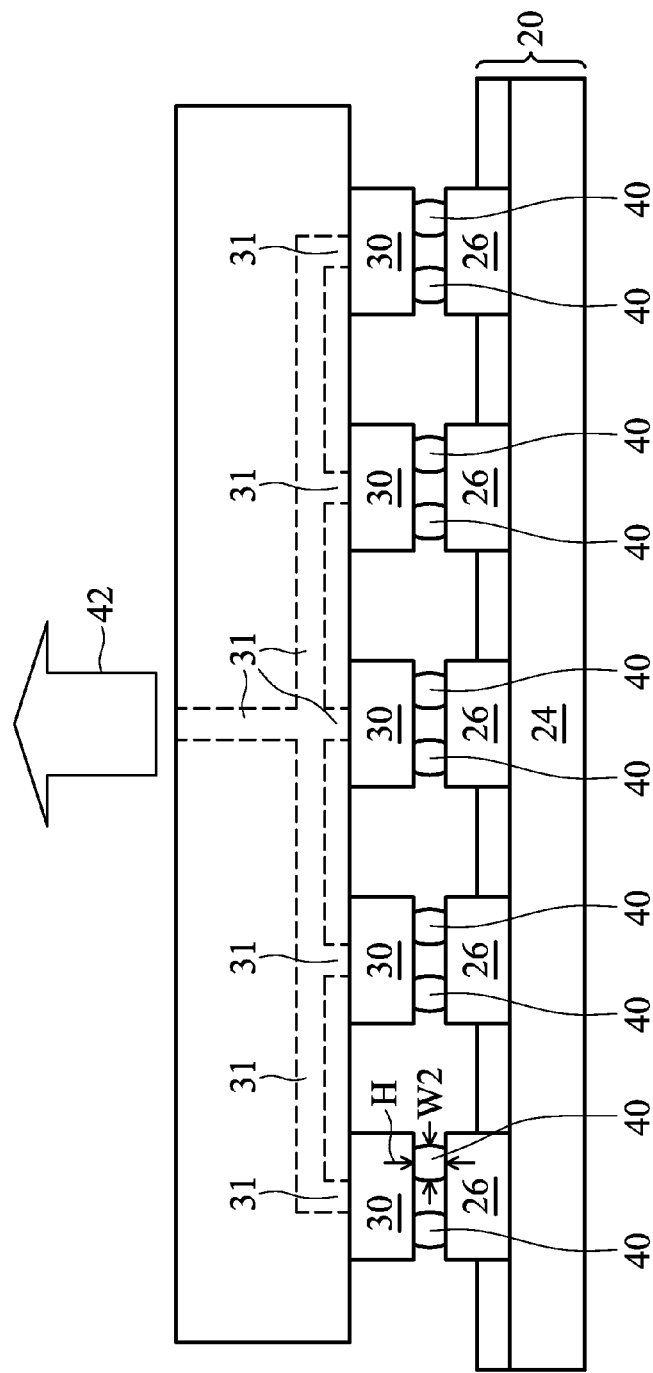

Next, as shown in FIG. 7, a bonding is performed. Heating tool 36 heats work pieces 30, and the heat is conducted to, and causing the reflow of, solder bumps 28 and 32. The resulting solder bumps formed of combined solder bumps 28 and 32 are referred to as solder bumps 40. In the embodiment as shown in FIG. 6A, all heating heads 38 are at a same temperature, and hence all of solder bumps 28 and 32 are melted. In the embodiment as shown in FIG. 6B, the surface portions of heating head 38 contacting different work pieces 30 have a substantially uniform temperature, and hence all of solder bumps 28 and 32 are melted substantially simultaneously. During the melting of solder bumps 28 and 32, heating tool 36 (and work pieces 30) may be kept at a fixed level to prevent the melted bumps 28 and 32 from further collapse, which may further cause neighboring bumps 28/32 to short to each other. After the reflow to form solder bumps 40, heating tool 36 applies an upward force, as symbolized by arrow 42, so that heights H of solder bumps 40 are increased, and horizontal sizes W2 of solder bumps 40 are reduced. The application of the upward force may be achieved, for example, by creating a vacuum in heating tool 36 to suck work pieces 30 up, wherein the vacuum may be generated in pipes 31. During the reflow process, heater 24 may have an elevated temperature to heat work pieces 26. Alternatively, heater 24 is not heated. The temperature of heating tool 36 is then lowered until solder bumps 40 solidify. The bonding process is then finished.

In the embodiments shown in FIGS. 4A through 7, all work pieces on substrate carrier 20 are bonded simultaneously. In alternative embodiments, substrate carrier 20 may be divided into a plurality of zones, with each zone including a plurality of work piece holders 22. The plurality of work pieces in a same zone my be bonded simultaneously using essentially the same methods as shown in FIGS. 4A through 7, while the work pieces in different zones may be bonded in different periods of time.

By using the embodiments, the throughput of the bonding process is significantly improved. For example, assuming ten chips are to be bonded to ten package substrates, and only one chip is bonded each time. The picking and placing of each chip takes 2 seconds, and the heating and reflowing of each chip takes 30 seconds. The total time required for bonding all 10 chips will be (2+30)×10, which is 320 seconds. As a comparison, by using the embodiments, although the picking and placing of ten chips still take 20 seconds in total, the heating and reflowing of ten chips only take 30 seconds due to the simultaneously reflowing of all chips. The total time is thus only 50 seconds. If more chips are bonded simultaneously, the improvement in the throughput is more significant. Since the cost of the TCB bonding is very high, the reduction in the cost of the bonding process due to the improved throughput is also significant.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   placing a first plurality of work pieces into work piece holders of a substrate carrier;
   picking up and placing a second plurality of work pieces, with each of the second plurality of work pieces being placed on one of the first plurality of work pieces;
   bringing the first plurality of work pieces in contact with a first heating tool, wherein the first heating tool is integral with the substrate carrier and heating the first plurality of work pieces with the first heating tool;
   bringing the second plurality of work pieces in contact with a second heating tool and heating the second plurality of work pieces with the second heating tool, the second heating tool being configured to apply a force on the second plurality of work pieces and being different than the first heating tool; and
   reflowing solder bumps between the first and the second plurality of work pieces to simultaneously bond the first and the second plurality of work pieces together.

2. The method of claim 1, wherein the second heating tool comprises a plurality of heating heads, and wherein the plurality of heating heads are configured to heat the second plurality of work pieces simultaneously.

3. The method of claim 1, wherein the second heating tool comprises a single heating head contacting all of the second plurality of work pieces, and wherein the single heating head is configured to heat the second plurality of work pieces simultaneously.

4. The method of claim 1 further comprising:
   before the step of reflowing, applying a downward force to press the second plurality of work pieces against the first plurality of work pieces;
   during the step of reflowing, holding the second plurality of work pieces at a fixed level; and
   after the solder bumps are melted and before the solder bumps are solidified, applying an upward force to the second plurality of work pieces to increase heights of the solder bumps.

5. The method of claim 1, wherein the first and the second plurality of work pieces are arranged as an array.

6. The method of claim 1, wherein the first plurality of work pieces fills all work piece holders in the substrate carrier.

7. The method of claim 1, wherein the first plurality of work pieces are package substrates, and the second plurality of work pieces are device dies.

8. A method comprising:
   placing a first plurality of work pieces into work piece holders of a substrate carrier;
   picking up and placing a second plurality of work pieces, with each of the second plurality of work pieces being vertically aligned to one of the first plurality of work pieces, wherein the each of the first plurality of work pieces comprises a first solder bump contacting a second solder bump of the each of the second plurality of work pieces;
   placing a first heating tool in contact with the first plurality of work pieces simultaneously, the first heating tool being integral with the substrate carrier;
   placing a second heating tool over and contacting the second plurality of work pieces simultaneously;
   heating the first plurality of work pieces using the first heating tool and heating the second plurality of work pieces using the second heating tool to perform a reflow process, wherein the first solder bump and the second solder bump are melted to form a third solder bump; and
   before the third solder bump is solidified, simultaneously applying an upward force to the second plurality of work pieces to increase a height of the third solder bump.

9. The method of claim 8, wherein the second heating tool comprises a plurality of heating heads, and wherein the plurality of heating heads are configured to heat the second plurality of work pieces simultaneously.

10. The method of claim 8, wherein the second heating tool comprises a single heating head contacting all of the second plurality of work pieces, and wherein the single heating head is configured to heat the second plurality of work pieces simultaneously.

11. The method of claim 8 further comprising, before and during the step of reflowing, applying a downward force to press the second plurality of work pieces against the first plurality of work pieces.

12. The method of claim 8, wherein the first and the second plurality of work pieces are arranged as an array.

13. The method of claim 8, wherein the first plurality of work pieces fills all work piece holders in the substrate carrier.

14. The method of claim 8, wherein the first plurality of work pieces are package substrates, and the second plurality of work pieces are device dies.

* * * * *